United States Patent [19]
Ikari et al.

[11] Patent Number: 5,880,651
[45] Date of Patent: Mar. 9, 1999

[54] REFLECTION-TYPE S/N ENHANCER

[75] Inventors: Masanori Ikari; Masayuki Tanno; Toshihiko Ryuo, all of Annaka; Takao Kuki; Toshihiro Nomoto, both of Tokyo, all of Japan

[73] Assignees: Shin-Etsu Chemical Co., Ltd.; Nippon Hoso Kyokai, both of Tokyo, Japan

[21] Appl. No.: 916,409

[22] Filed: Aug. 22, 1997

[30] Foreign Application Priority Data

Aug. 23, 1996 [JP] Japan ................................. 8-222389

[51] Int. Cl.⁶ ........................................ H01P 1/215
[52] U.S. Cl. ........................................ 333/202; 333/24.1
[58] Field of Search ........................ 333/24.1, 24.2, 333/201, 202, 204

[56] References Cited

U.S. PATENT DOCUMENTS

| | | | |
|---|---|---|---|
| 4,595,889 | 6/1986 | Stitzer et al. | 333/24.1 X |
| 5,601,935 | 2/1997 | Fujino et al. | 333/201 X |

FOREIGN PATENT DOCUMENTS

| | | | |
|---|---|---|---|
| 3-214901 | 9/1991 | Japan | 333/201 |
| 7130539 | 5/1995 | Japan . | |

OTHER PUBLICATIONS

"A Consideration on MSSW/BVW Hybrid Modes for an S/N Enhancer" by T. Kuki et al; 1996.

"A Signal–To–Noise Enhancer Using Two MSSW Filters and its Application to Noise Reduction in DBS Reception" by T. Nomoto et al; IEEE Transaction on Microwave Theory and Techniques, vol. 41, No. 8, Aug. 1993.

"A Signal–To–Noise Enhancer with Extended Bandwidth Using Two MSSW Filters and and Two 90° Hybrids" by Y. Ishikawa et al: 1994 Asia Pacific Microwave Conference.

"A Reflection Type of MSW Signal–To–Noise Enhancer in the 400–MHz Band" by T. Kuki et al; 1995 IEEE MTT–S Digest.

"Surface Morphologies and Quality of Thick Liquid Phase Epitaxial Garnet Films for Magneto–Optic Devices" by T. Hibiya; Journal of Crystal Growth 62 (1983)87–94; North–Holland Publishing Company.

*Primary Examiner*—Paul Gensler
*Attorney, Agent, or Firm*—Lowe Hauptman Gopstein Gilman & Berner

[57] ABSTRACT

A reflection-type S/N enhancer includes a $Gd_3Ga_5O_{12}$ substrate off-angled from a {110} plane. A magnetic thin film including a crystal of garnet is formed on the $Gd_3Ga_5O_{12}$ substrate by liquid-phase epitaxy. The magnetic thin film has a saturation magnetization in a range of 500 G to 1,100 G. A transducer is operative for exciting magnetostatic wave in the magnetic thin film in response to an RF electric signal. A bias magnetic field is applied to the magnetic thin film. There is a relation as $|\theta_1+\theta_2|<45°$, where "$\theta_1$" denotes an angle between a longitudinal direction of the transducer and a <001> orientation of the crystal in the magnetic thin film, and "$\theta_2$" denotes an angle between a direction of the bias magnetic field and a transverse direction of the transducer in a horizontal plane. The transverse direction of the transducer is perpendicular to the longitudinal direction thereof.

4 Claims, 8 Drawing Sheets

FIG. 8

| FILM COMPOSITION | $4\pi Ms$ | $\Delta H$ | USUFUL RANGE OF $\theta 1 + \theta 2$ | PERFORMANCE INDEX |
|---|---|---|---|---|
| $La_{0.10}Y_{2.90}Fe_{4.60}Ga_{0.40}O_{12}$ | 1100G | 0.90e | $\pm 20°$ | 1.9 |
| $La_{0.13}Y_{2.87}Fe_{4.39}Ga_{0.61}O_{12}$ | 800G | 1.30e | $+9° \sim +31° (-9° \sim -31°)$ | 2.2 |
| $La_{0.14}Y_{2.86}Fe_{4.33}Ga_{0.67}O_{12}$ | 700G | 1.30e | $+6° \sim +34° (-6° \sim -34°)$ | 2.2 |
| $La_{0.15}Y_{2.85}Fe_{4.25}Ga_{0.75}O_{12}$ | 600G | 1.40e | $-40° \sim +40°$ | 2.2 |
| $La_{0.16}Y_{2.84}Fe_{4.15}Ga_{0.85}O_{12}$ | 500G | 1.60e | $-45° \sim +45°$ | 2.3 |
| $La_{0.17}Y_{2.83}Fe_{4.11}Ga_{0.89}O_{12}$ | 400G | 2.80e | $-50° \sim +50°$ | 4.2 | ic
REFLECTION-TYPE S/N ENHANCER

BACKGROUND OF THE INVENTION

1. Field of the Invention

This invention relates to an S/N (signal-to-noise ratio) enhancer for a receiver such as a satellite broadcasting television receiver or a DBS receiver.

2. Description of the Related Art

As an RF signal received by a satellite broadcasting television receiver weakens due to rain, snow (white specks) increases in reproduced pictures on a display of the television receiver. When the received RF signal falls into an unacceptable range, it is difficult to reproduce pictures on the display.

T. Nomoto et al have proposed an S/N enhancer for improving the signal-to-noise ratio of a received RF television signal (T. Nomoto et al., IEEE Trans. on Microwave Theory and Techniques, Vol. 41, No. 8, Aug. 1993, pp. 1316–1322). This prior-art S/N enhancer is of the cancel type, using two magnetostatic surface wave filters.

Y. Ishikawa et al have developed an adaptor for a satellite broadcasting television receiver (Y. Ishikawa et al., Proc. of 1994 Asia Pacific Conference, pp. 179–183). This prior-art adaptor uses an S/N enhancer designed to operate for a 1.9-GHz band. In the prior-art adaptor, a signal in a first IF band of 1 GHz to 1.3 GHz which is derived from a received RF signal is up-converted to a 1.9-GHz signal, and the 1.9-GHz signal is processed by the S/N enhancer. The processing-resultant signal, that is, the filtering-resultant signal, is down-converted back to a signal in the first IF band. The prior-art adaptor includes frequency converters in addition to the S/N enhancer. Thus, the prior-art adaptor tends to be expensive.

An S/N enhancer capable of operating at frequencies of 1 GHz to 1.3 GHz has been desired. Also, an S/N enhancer has been desired which can operate for a 400-MHz band, that is, a second IF band in a satellite broadcasting television receiver.

Japanese published unexamined patent application 7-130539 discloses a magnetostatic surface wave device. This prior-art magnetostatic surface wave device includes a film of single crystal of garnet which is grown on a $Gd_3Ga_5O_{12}$ substrate. The $Gd_3Ga_5O_{12}$ substrate has a plane orientation being one from among (110), (100), and (211). In the prior-art magnetostatic surface wave device, an anisotropic magnetic field can be weak so that the lower limit of the frequency band for the propagation of magnetostatic surface wave can be a relatively low frequency. In Japanese application 7-130539, the lowest frequency of magnetostatic surface wave is 900 MHz when a saturation magnetization is 1,760 G and the plane orientation of the substrate is (100). Accordingly, it is difficult to use the prior-art magnetostatic surface wave device as an S/N enhancer operating for a 400-MHz band.

T. Kuki et al have developed a reflection-type S/N enhancer operating for a 400-MHz band (T. Kuki et al., 1995 IEEE MTT-S Digest, pp. 111–114). To attain an operating frequency of 400 MHz, this prior-art reflection-type S/N enhancer uses a thin film of YIG which has a relatively low saturation magnetization equal to 360 G. According to the result of the evaluation of the dynamic characteristics of the prior-art reflection-type S/N enhancer, its performance index (a saturation time delay "$\tau$" multiplied by an entrainment frequency width "Ba") is equal to 4.6. This value of the performance index means difficulty with practical use of the prior-art reflection-type S/N enhancer.

T. Kuki et al used a magnetostatic wave in a reflection-type S/N enhancer designed as a mixture of surface wave and backward volume wave (T. Kuki et al., Manuscript C-106, General Meeting 1996, Japanese Institute of Electronics, Information and Communication Engineers). This prior-art design is effective in lowering and widening the operating frequency band of the reflection-type S/N enhancer although a saturation magnetization is relatively great. The prior-art design fails to improve the dynamic characteristics of a reflection-type S/N enhancer operating at around 400 MHz.

SUMMARY OF THE INVENTION

It is an object of this invention to provide a 400-MHz-band reflection-type S/N enhancer which has improved dynamic characteristics.

A first aspect of this invention provides a reflection-type S/N enhancer comprising a $Gd_3Ga_5O_{12}$ substrate off-angled from a {110} plane; a magnetic thin film including a crystal of garnet and being formed on the $Gd_3Ga_5O_{12}$ substrate by liquid-phase epitaxy, the magnetic thin film having a saturation magnetization in a range of 500 G to 1,100 G; a transducer for exciting magnetostatic wave in the magnetic thin film in response to an RF electric signal; and means for applying a bias magnetic field to the magnetic thin film; wherein there is a relation as $|\theta_1+\theta_2|<45°$, where "$\theta_1$" denotes an angle between a longitudinal direction of the transducer and a <001> orientation of the crystal in the magnetic thin film, and "$\theta_2$" denotes an angle between a direction of the bias magnetic field and a transverse direction of the transducer in a horizontal plane, the transverse direction of the transducer being perpendicular to the longitudinal direction thereof.

A second aspect of this invention is based on the first aspect thereof, and provides a reflection-type S/N enhancer wherein the $Gd_3Ga_5O_{12}$ substrate is off-angled from the {110} plane by an angle in a range of 1° to 5°.

A third aspect of this invention is based on the first aspect thereof, and provides a reflection-type S/N enhancer wherein the magnetic thin film consists of one layer.

A fourth aspect of this invention is based on the first aspect thereof, and provides a reflection-type S/N enhancer wherein the magnetic thin film includes multiple layers.

BRIEF DESCRIPTION OF THE DRAWINGS

FIG. 8 is a diagram of the relation among a YIG composition, a saturation magnetization "$4\pi Ms$", a half-value width "$\Delta H$", a useful range of the sum of angles $\theta_1$ and $\theta_2$, and a performance index.

DESCRIPTION OF THE PREFERRED EMBODIMENT

Figure 1:
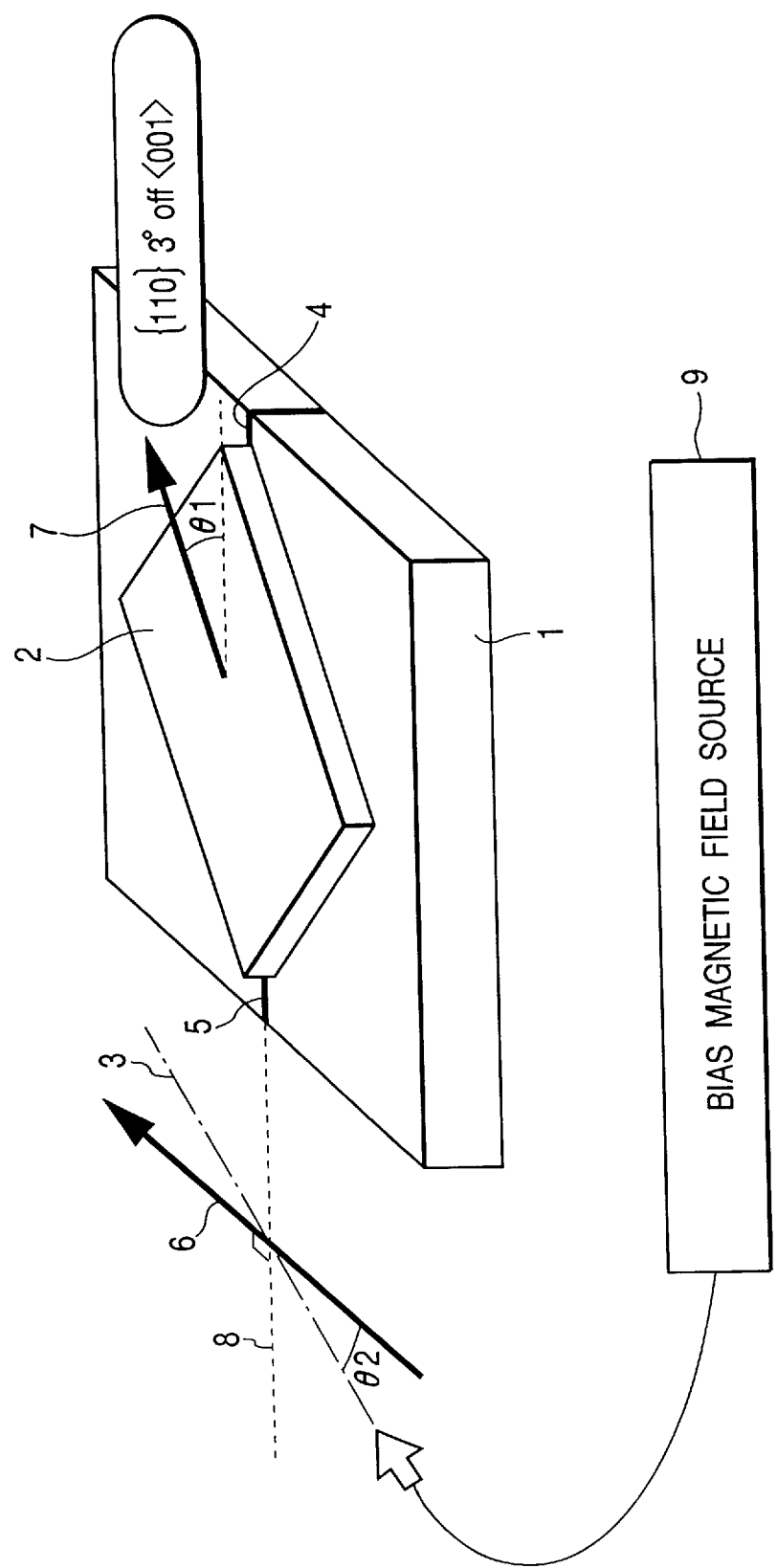
FIG. 1 is a diagram including a perspective view of a functional portion of a reflection-type S/N enhancer according to an embodiment of this invention.

With reference to FIG. 1, a reflection-type S/N enhancer includes a dielectric substrate 1 on which a magnetic thin film 2 of crystal (cubic crystal) of garnet is formed by, for example, liquid-phase epitaxy. A lower surface or a bottom surface of the dielectric substrate 1 is formed with a ground plane. The magnetic thin film 2 serves as a magnetostatic wave element. The magnetic thin film 2 is off-angled from or misoriented with respect to the {110} plane of the dielectric substrate 1 by a value in the range of 1° to 5°.

In FIG. 1, the numeral 3 denotes the direction of a bias magnetic field applied by a suitable device 9 referred to as a bias magnetic field source.

A transducer 4 provided on the dielectric substrate 1 connects with the magnetic thin film 2. The transducer 4 is used in exciting a magnetostatic wave in response to an RF electric signal (RF electromagnetic wave). The transducer 4 is designed to provide acceptable impedance matching between an electromagnetic wave and a magnetostatic wave. An input/output port 5 provided on the dielectric substrate 1 connects with the transducer 4.

In FIG. 1, the numeral 6 denotes a transverse direction of the transducer 4 which agrees with a direction of the propagation of magnetostatic wave. The transverse direction 6 is in a horizontal plane, and is a perpendicular to the longitudinal direction 8 of the transducer 4. In addition, the numeral 7 denotes the <001> orientation of the crystal in the magnetic thin film 2. Furthermore, the character $\theta_1$ denotes the angle between the longitudinal direction 8 of the transducer 4 and the <001> orientation 7 of the magnetic thin film 2, and the character $\theta_2$ denotes the angle between the direction 3 of the bias magnetic field and the transverse direction 6 of the transducer 4 in a horizontal plane.

The magnetic thin film 2 has only a single layer or multiple layers.

It is preferable that the saturation magnetization "$4\pi Ms$" of the magnetic thin film 2 is in the range of 500 G to 1,100 G. When the saturation magnetization "$4\pi Ms$" of the magnetic thin film 2 is smaller than 500 G, the performance index of the reflection-type S/N enhancer is equal to 4 or more. This value of the performance index means difficulty with practical use. When the saturation magnetization "$4\pi Ms$" of the magnetic thin film 2 exceeds 1,100 G, it is difficult that the reflection-type S/N enhancer properly operates at a frequency of 400 MHz.

It is preferable that the absolute value of the sum of the angles $\theta_1$ and $\theta_2$ is smaller than 45° (that is, $|\theta_1+\theta_2|<45°$).

In the case where the saturation magnetization "$4\pi Ms$" of the magnetic thin film 2 is in the range of 500 G to 1,100 G and the absolute value of the sum of the angles $\theta_1$ and $\theta_2$ is smaller than 45° ($|\theta_1+\theta_2|<45°$), the reflection-type S/N enhancer properly operates for a 400-MHz frequency band and has a considerably improved performance index.

The mode of the propagation of excited magnetostatic wave in the magnetostatic wave element (the magnetic thin film 2) of the reflection-type S/N enhancer is one among a mode using only magnetostatic surface wave (MSSW), a mode using only magnetostatic backward volume wave (MSBVW), and a mode using a mixture of magnetostatic surface wave (MSSW) and magnetostatic backward volume wave (MSBVW).

The frequency "f" of magnetostatic wave excited in the mode related to magnetostatic backward volume wave (MSBVW) is approximately given by the following equation.

$$f=\gamma\{(H+Ha)\cdot(H+Ha+4\pi Ms)\}^{1/2} \qquad (1)$$

where "H" denotes the bias magnetic field; "Ha" denotes the anisotropic magnetic field caused by a 1-order anisotropy constant of the cubic crystal; "$4\pi Ms$" denotes the saturation magnetization of the magnetic thin film 2; and "$\gamma$" denotes a rotational magnetism ratio (2.8 MHz/Oe).

The saturation magnetization "$4\pi Ms$" of the magnetic thin film 2 and the anisotropic magnetic field Ha depend on temperature. Accordingly, the frequency "f" of excited magnetic wave depends on temperature in the case where a constant magnetic field is applied as the bias magnetic field H.

The anisotropic magnetic field Ha varies as a function of the crystal orientation, the saturation magnetization "$4\pi Ms$", and the 1-order anisotropy constant $K_1$. The anisotropic magnetic field Ha is expressed as follows.

$$Ha=\{2-(5/2)\cdot\sin^2\theta-(15/8)\cdot\sin^2(2\theta)\}K_1/4\pi Ms \qquad (2)$$

where "$\theta$" denotes the angle between the <001> orientation and the direction of the bias magnetic field or an RF magnetic field in the {110} plane of the dielectric substrate 1. According to the equation (2), the anisotropic magnetic field Ha is nullified when the angle "$\theta$" is equal to about ±30°. Therefore, even if the saturation magnetization "$4\pi Ms$" is greater than 365 G (a prior-art value), the reflection-type S/N enhancer can properly operate while the frequency "f" in the equation (1) is equal to or higher than a relatively low value. In this case, the FMR (ferromagnetic resonance) linewidth $\Delta H$ of the magnetic thin film 2 is small so that the dynamic characteristics of the reflection-type S/N enhancer can be improved. The FMR linewidth $\Delta H$ is also referred to as the half-value width.

As previously explained, the magnetic thin film 2 of garnet is grown on the {110} plane of the dielectric substrate 1. The mode of the propagation of excited magnetostatic wave in the magnetostatic wave element (the magnetic thin film 2) of the reflection-type S/N enhancer is one among the mode using only magnetostatic surface wave (MSSW), the mode using only magnetostatic backward volume wave (MSBVW), and the mode using a mixture of magnetostatic surface wave (MSSW) and magnetostatic backward volume wave (MSBVW). In this case, the optimization of the direction of the bias magnetic field or the RF magnetic field makes it possible that the reflection-type S/N enhancer properly operates while the frequency "f" in the equation (1) is equal to about 400 MHz. Furthermore, since the saturation magnetization "$4\pi Ms$" of the magnetic thin film 2 is great and hence the FMR (ferromagnetic resonance) linewidth $\Delta H$ of the magnetic thin film 2 is small, the dynamic characteristics of the reflection-type S/N enhancer can be remarkably improved.

T. Hibiya has reported that during liquid-phase epitaxy on a {110} garnet substrate, crystal tends to abnormally grow, and that a thick film of the crystal is hardly available in this case (T. Hibiya, J. Crystal Growth, 62, p. 87 (1983)). Also, T. Hibiya has reported that use of an off-angled substrate slightly inclined with respect to the {110} plane enables the formation of a thick film.

Experiments were carried out as follows. During the experiments, single-layer structures and multiple-layer structures were grown on {110} off-angled or misoriented substrates by liquid-phase epitaxy. Transducers for exciting magnetostatic wave were provided on the {110} off-angled substrates. Thereby, various samples of a reflection-type S/N enhancer were fabricated. The single-layer structures and the multiple-layer structures had saturation magnetizations "$4\pi Ms$" in the range of 500 G to 1,100 G. There were various relations between the crystal orientations and the transducer orientations. For each of the samples, the excitation frequency of magnetostatic wave was measured. The following facts was found. The excitation frequency of magnetostatic wave was a small value equal to about 400 MHz in the case of a specified relation between the crystal orientation and the transducer orientation which occurred under conditions where a constant bias magnetic field was applied while the mode of the propagation of magnetostatic wave was one among the mode using only magnetostatic surface wave (MSSW), the mode using only magnetostatic backward volume wave (MSBVW), and the mode using a mixture of magnetostatic surface wave (MSSW) and magnetostatic backward volume wave (MSBVW). The enhancer samples related to excitation frequencies of about 400 MHz had improved dynamic characteristics.

It is preferable that the magnetic thin film 2 of garnet, that is, the magnetostatic wave element, is formed by liquid-phase epitaxy on a $Gd_3Ga_5O_{12}$ substrate which is off-angled from or misoriented with respect to the {110} plane by a value in the range of 1° to 5°. When the off-angle is smaller than 1°, crystal tends to abnormally grow so that a thick film of the crystal is hardly available. When the off-angle exceeds 5°, the FMR (ferromagnetic resonance) linewidth $\Delta H$ of the magnetic thin film 2 tends to be unacceptably great.

EXAMPLE 1

Samples of the reflection-type S/N enhancer were fabricated as follows. For each of the samples, a $Gd_3Ga_5O_{12}$ substrate was prepared which was off-angled from the {110} plane by 3°. A magnetic thin film of YIG having composition "$La_{0.12}Y_{2.88}Fe_{4.46}Ga_{0.54}O_{12}$" was grown on the $Gd_3Ga_5O_{12}$ substrate by liquid-phase epitaxy. The magnetic thin film had a thickness of 59 $\mu m$. The magnetic thin film exhibited a saturation magnetization "$4\pi Ms$" of 920 G at room temperature. Regarding the magnetic thin film, the half-value width (the FMR linewidth) $\Delta H$ was equal to 1.3 Oe.

For each of the samples, the magnetic thin film was cut and shaped into a chip in a manner such that a pair of opposite side surfaces of the chip extended in directions parallel to the <001> orientation. The chip had a size of 12 mm by 12 mm. A sample of the reflection-type S/N enhancer was completed which used the magnetic thin film. The sample of the reflection-type S/N enhancer had the structure of FIG. 1.

According to the samples of the reflection-type S/N enhancer, the angle $\theta_1$ between the longitudinal direction of the transducer and the <001> orientation of crystal in the magnetic thin film was variable in the range of 45° to −45°. Since the YIG crystal in the magnetic thin film is cubic, the range of the angle $\theta_1$ is symmetrical with respect to the <001> orientation. The samples of the reflection-type S/N enhancer provided a variable angle $\theta_2$ between the direction of the applied magnetic field (the bias magnetic field) and the transverse direction of the transducer in a horizontal plane. The transverse direction of the transducer is perpendicular to the longitudinal direction thereof.

Comparative samples were similarly made. According to the comparative samples, the angle $\theta_1$ between the longitudinal direction of the transducer and the <001> orientation of crystal in the magnetic thin film was variable outside the range of 45° to −45°.

Figure 2:
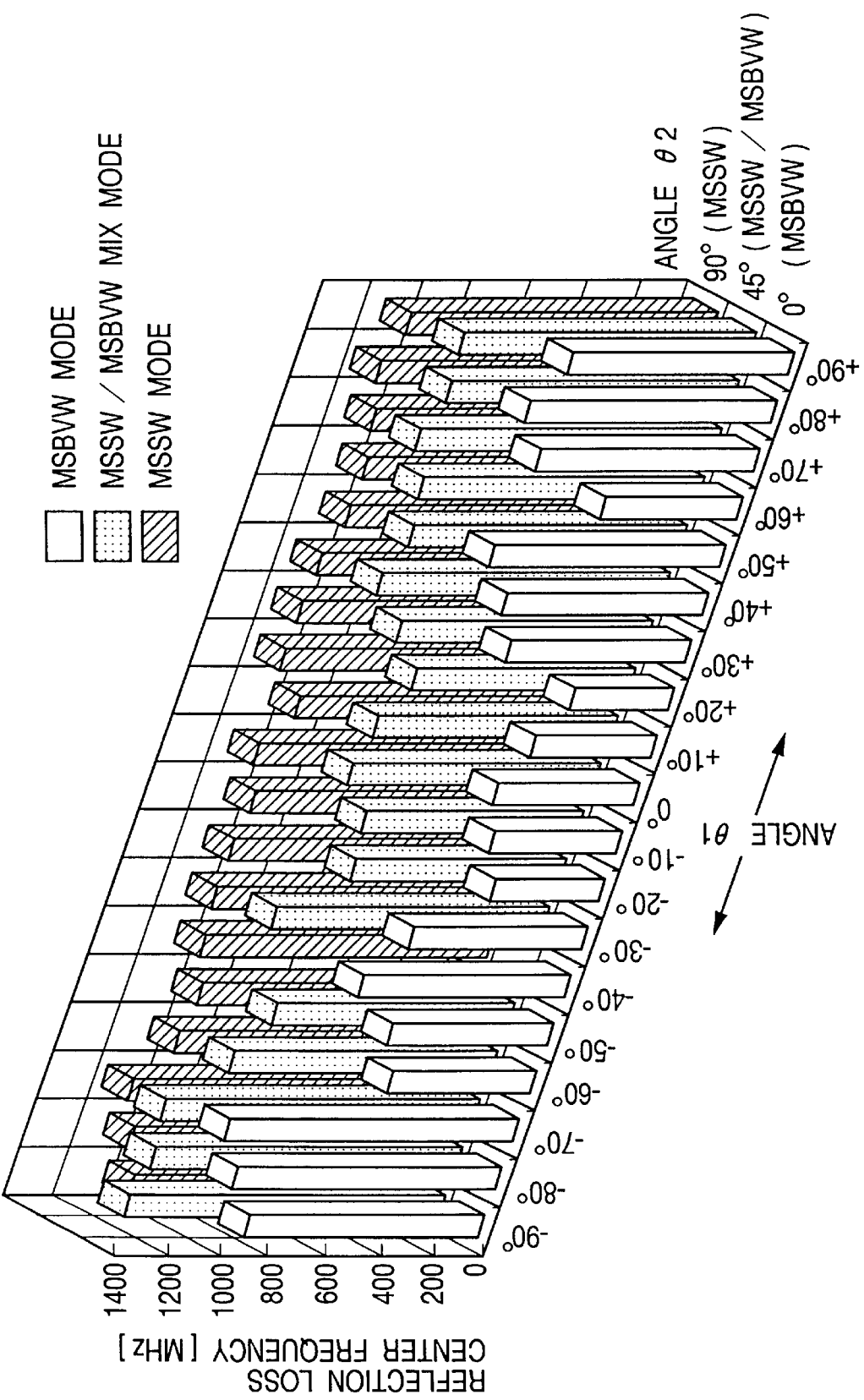
FIG. 2 is a diagram of the relation among the lowest value of a center frequency of a reflection loss, and angles $\theta_1$ and $\theta_2$ regarding various samples of reflection-type S/N enhancers.

Each of the samples of the reflection-type S/N enhancer and also the comparative samples was subjected to an external magnetic field or a bias magnetic field having a given strength (equal to about 5 G to 50 G), and the lowest value of a central frequency of a reflection loss was measured while magnetostatic wave was excited at varying angles $\theta_1$ and $\theta_2$. The mode of the propagation of excited magnetostatic wave was changed among the mode using only magnetostatic surface wave (MSSW), the mode using only magnetostatic backward volume wave (MSBVW), and the mode using a mixture of magnetostatic surface wave (MSSW) and magnetostatic backward volume wave (MSBVW). The measurement results of the lowest values of the center frequencies of the reflection losses are indicated in FIG. 2.

Figure 3:
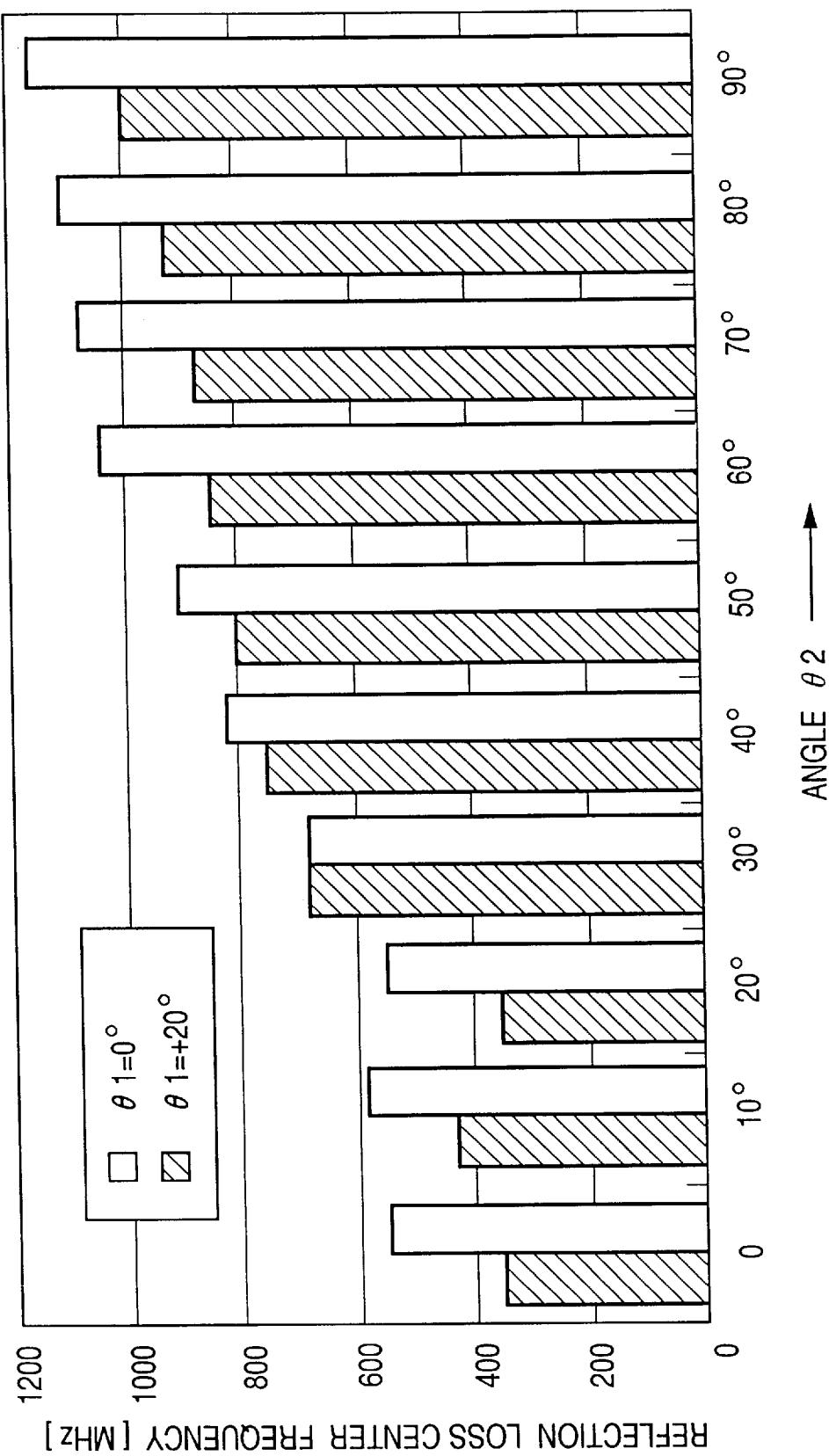
FIG. 3 is a diagram of the relation among the lowest value of a center frequency a reflection loss, and an angle $\theta_2$ regarding samples of reflection-type S/N enhancers which have angles $\theta_1$ of 0° and +20°.

Especially, regarding the samples having the angles $\theta_1$ equal to 0° and +20°, the center frequency of the reflection loss was measured while the angle $\theta_2$ was varied in the range of 0° to +90°. The results of this measurement are indicated in FIG. 3.

The previously-indicated measurement results revealed that when the sum of the angles $\theta_1$ and $\theta_2$ was in the range of 14° to 26° or in the range of −14° to −26°, the corresponding samples served as reflection-type S/N enhancers capable of operating at a frequency of about 400 MHz.

Figure 4:
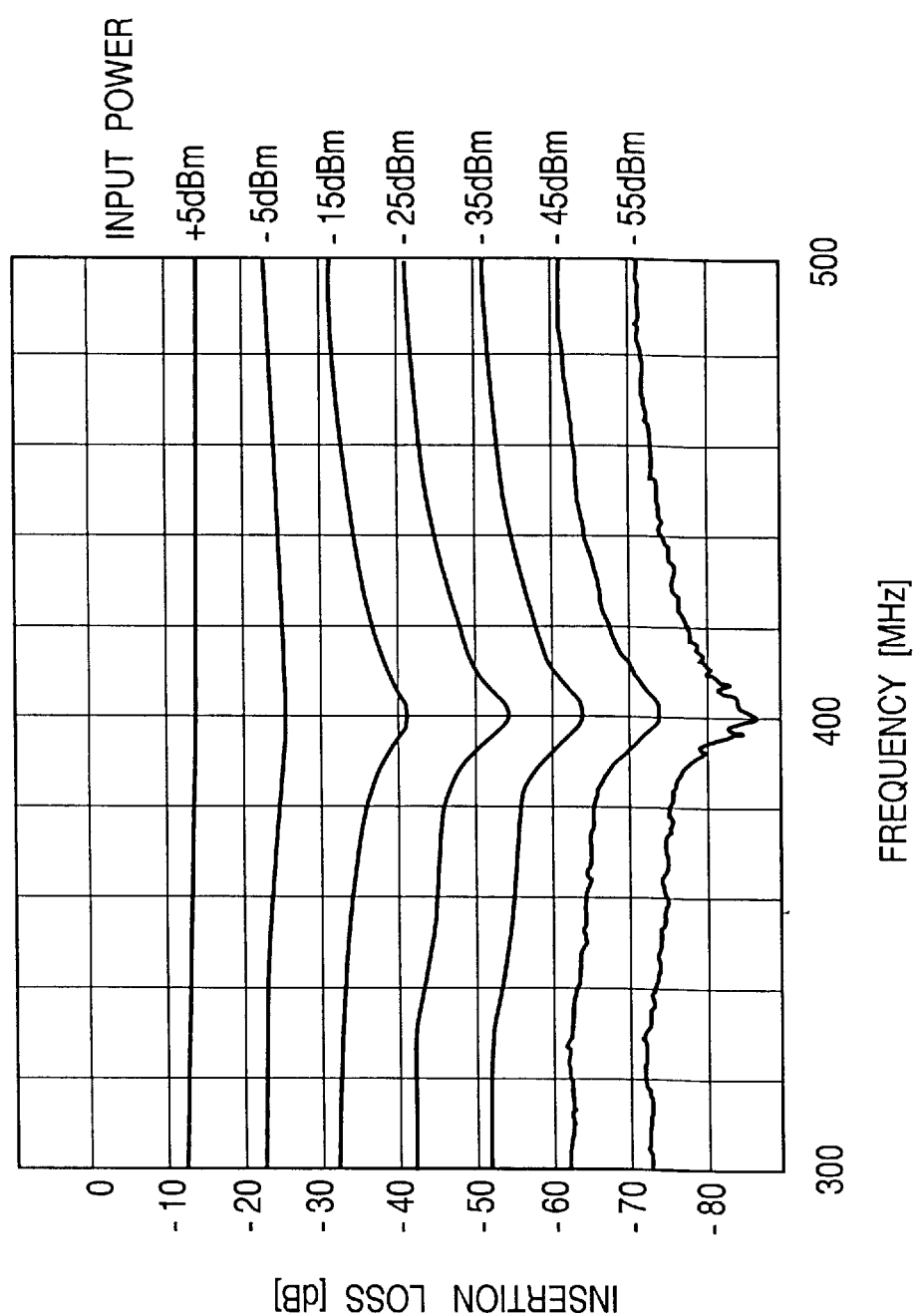
FIG. 4 is a diagram of the relation among an insertion loss, the level of an input power, and a frequency of the input power.

Measurements were made as to the insertion loss of a typical sample of the reflection-type S/N enhancer under the conditions where the angle $\theta_1$ was 15° and the angle $\theta_2$ was 10°. The insertion loss agreed with the ratio between the input power and the output power regarding the sample of the reflection-type S/N enhancer. The insertion loss was measured at varying levels of the input power and varying frequencies of the input power. The results of the measurements of the insertion loss are shown in FIG. 4. It was found that the insertion loss was substantially independent of the frequency of the input power when the level of the input power was −5 dBm or greater. Also, it was found that the insertion loss remarkably peaked at about 400 MHz and the sample served as an effective reflection-type S/N enhancer when the level of the input power was −15 dBm or lower.

Measurements were made as to the dynamic characteristics (the saturation time delay and the frequency entrainment) of the typical sample of the reflection-type S/N enhancer capable of operating for a 400-MHz band.

Figure 5:
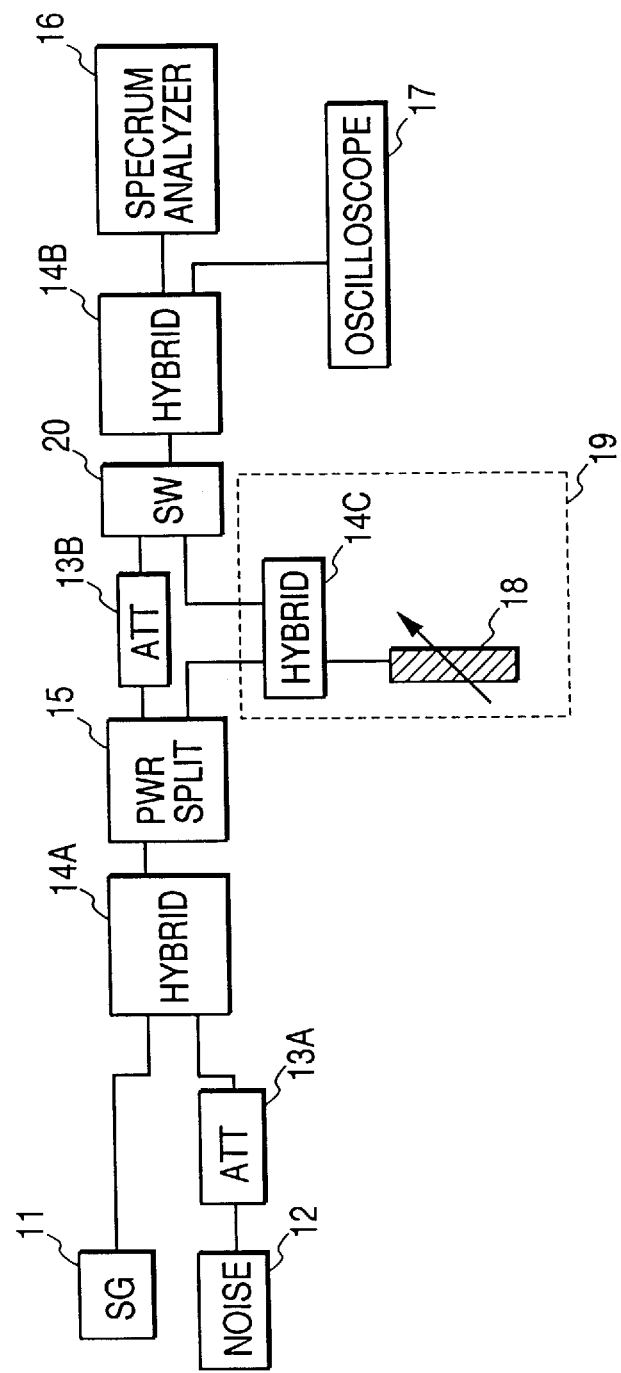
FIG. 5 is a lock diagram of a measuring system.

FIG. 5 shows a system used for the measurements of the dynamic characteristics. The system of FIG. 5 includes a signal generator 11 whose output terminal is connected to a first port of a hybrid junction 14A. The output terminal of a noise generator 12 is connected via an attenuator 13A to a second port of the hybrid junction 14A. A third port of the hybrid junction 14A is connected to an input port of a power splitter 15. A first output port of the power splitter 15 is connected via an attenuator 13B to a first input terminal of a switch 20. A second output port of the power splitter 15 is connected via a reflection-type S/N enhancer 19 to a second input terminal of the switch 20. An output terminal of the switch 20 is connected to a first port of a hybrid junction 14B. A second port of the hybrid junction 14B is connected to a spectrum analyzer 16. A third port of the hybrid junction 14B is connected to an oscilloscope 17. The reflection-type S/N enhancer 19 includes a functional portion 18 and a hybrid junction 14C. The hybrid junction 14C is connected among the power splitter 15, the switch 20, and the functional portion 18.

Figure 6:
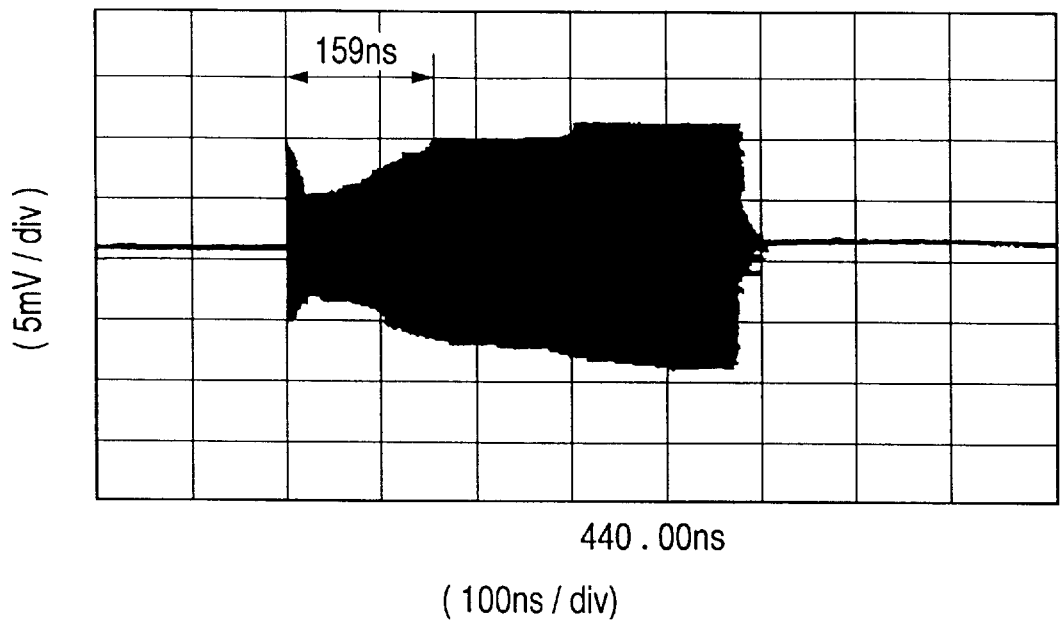
FIG. 6 is a time-domain diagram of an output signal from a reflection-type S/N enhancer which occurs when a pulse of a 400-MHz signal is inputted to the reflection-type S/N enhancer.

The saturation transient response time "τ" of the reflection-type S/N enhancer 19 was measured under the following conditions. Pulses of a 400-MHz signal with a level of 1 dBm were applied to the reflection-type S/N enhancer 19 from the signal generator 11 via the hybrid junction 14A and the power splitter 15. The pulses of the 400-MHz signal had a width of about 500 nsec. An output signal from the reflection-type S/N enhancer 19 was fed to the oscilloscope 17 via the switch 20 and the hybrid junction 14B. Every pulse of the input 400-MHz signal caused a pulse-like waveform of the output signal from the reflection-type S/N enhancer 19. The pulse-like waveform of the output signal from the reflection-type S/N enhancer 19 was monitored by the oscilloscope 17. An example of the pulse-like waveform of the output signal from the reflection-type S/N enhancer 19 is shown in FIG. 6. The saturation transient response time "τ" of the reflection-type S/N enhancer 19 was measured by referring to the pulse-like waveform indicated on the oscilloscope 17. The measurement result of the saturation transient response time "τ" was equal to 159 nsec. The saturation transient response time "τ" was defined as a time interval from the moment of the start of a pulse to the moment at which the amplitude of the output signal of the reflection-type S/N enhancer 19 rises to 90% of the normal amplitude.

Figure 7:
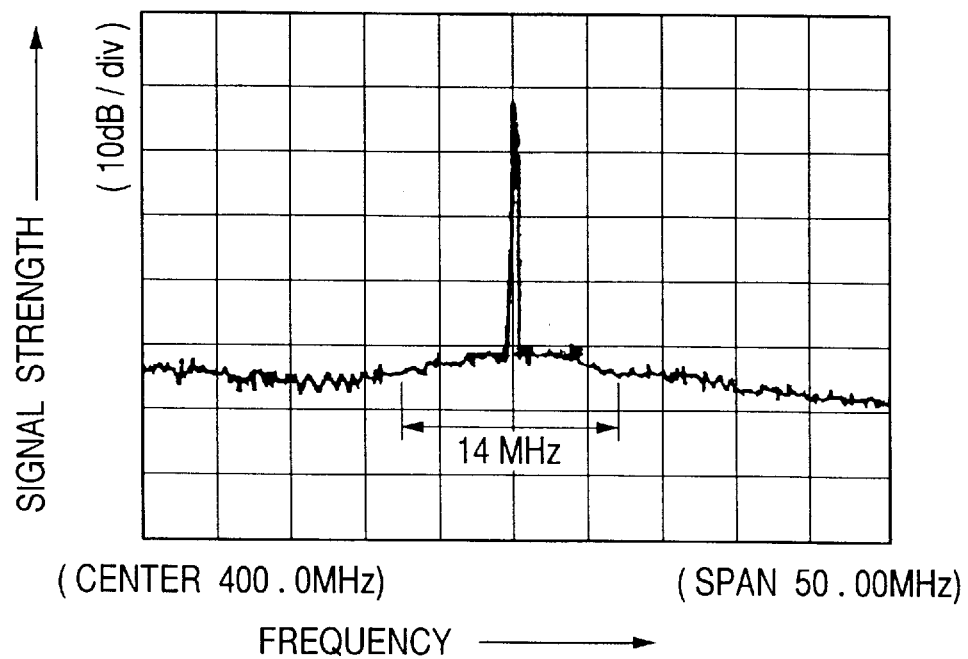
FIG. 7 is a frequency-domain diagram of an output signal from a reflection-type S/N enhancer which occurs when a 400-MHz signal modulated by random noise is continuously inputted to the reflection-type S/N enhancer.

The entrainment frequency width "Ba" of the reflection-type S/N enhancer 19 was measured under the following conditions. A 400-MHz signal with a level of 1 dBm was continuously applied to the reflection-type S/N enhancer 19 from the signal generator 1 via the hybrid junction 14A and the power splitter 15. Random noise was fed from the noise generator 12 to the hybrid junction 14A via the attenuator 13A. The hybrid junction 14A superimposed the random noise on the 400-MHz signal applied to the reflection-type S/N enhancer 19. An output signal from the reflection-type S/N enhancer 19 was fed to the spectrum analyzer 16 via the switch 20 and the hybrid junction 14B. The frequency spectrum of the output signal from the reflection-type S/N enhancer 19 was monitored by the spectrum analyzer 16. An example of the frequency spectrum of the output signal from the reflection-type S/N enhancer 19 is shown in FIG. 7. The entrainment frequency width "Ba" of the reflection-type S/N enhancer 19 was measured by referring to the frequency spectrum indicated on the spectrum analyzer 16. The measurement result of the entrainment frequency width "Ba" was equal to 14 MHz. The entrainment frequency width "Ba" was defined as a frequency width in which the ratio between the level of the 400-MHz signal and the level of the noise was improved by at least 3 dB.

The performance index of the reflection-type S/N enhancer 19 was defined as the product of the saturation transient response time "τ" and the entrainment frequency width "Ba" thereof. The performance index of the reflection-type S/N enhancer 19 was equal to 2.2 which was in the practically usable range.

Generally, the magnetic thin film has only a single layer. The magnetic thin film may have multiple layers designed to provide a wider frequency band of the related reflection-type S/N enhancer.

EXAMPLE 2

Samples of the reflection-type S/N enhancer were fabricated as follows. For each of the samples, a $Gd_3Ga_5O_{12}$ substrate was prepared which was off-angled from the {110} plane by 3°. Magnetic thin films of YIG having various compositions "$(LaY)_3(FeGa)_5O_{12}$" were grown on the respective $Gd_3Ga_5O_{12}$ substrates by liquid-phase epitaxy. First YIG composition was "$La_{0.10}Y_{2.90}Fe_{4.60}Ga_{0.40}O_{12}$". Second YIG composition was "$La_{0.13}Y_{2.87}Fe_{4.39}Ga_{0.61}O_{12}$". Third YIG composition was "$La_{0.14}Y_{2.86}Fe_{4.33}Ga_{0.67}O_{12}$". Fourth YIG composition was "$La_{0.15}Y_{2.85}Fe_{4.25}Ga_{0.75}O_{12}$". Fifth YIG composition was "$La_{0.16}Y_{2.84}Fe_{4.15}Ga_{0.85}O_{12}$". Sixth YIG composition was "$La_{0.17}Y_{2.83}Fe_{4.11}Ga_{0.89}O_{12}$". The magnetic thin films had a thickness of 50 μm.

The magnetic thin films of $La_{0.10}Y_{2.90}Fe_{4.60}Ga_{0.40}O_{12}$ exhibited a saturation magnetization "$4\pi Ms$" of 1,100 G at room temperature. The magnetic thin films of $La_{0.13}Y_{2.87}Fe_{4.39}Ga_{0.61}O_{12}$ exhibited a saturation magnetization "$4\pi Ms$" of 800 G at room temperature. The magnetic thin films of $La_{0.14}Y_{2.86}Fe_{4.33}Ga_{0.67}O_{12}$ exhibited a saturation magnetization "$4\pi Ms$" of 700 G at room temperature. The magnetic thin films of $La_{0.15}Y_{2.85}Fe_{4.25}Ga_{0.75}O_{12}$ exhibited a saturation magnetization "$4\pi Ms$" of 600 G at room temperature. The magnetic thin films of $La_{0.16}Y_{2.84}Fe_{4.15}Ga_{0.85}O_{12}$ exhibited a saturation magnetization "$4\pi Ms$" of 500 G at room temperature. The magnetic thin films of $La_{0.17}Y_{2.83}Fe_{4.11}Ga_{0.89}O_{12}$ exhibited a saturation magnetization "$4\pi Ms$" of 400 G at room temperature.

Regarding the magnetic thin films of $La_{0.10}Y_{2.90}Fe_{4.60}Ga_{0.40}O_{12}$, the half-value width (the FMR linewidth) $\Delta H$ was equal to 0.90 Oe. Regarding the magnetic thin films of $La_{0.13}Y_{2.87}Fe_{4.39}Ga_{0.61}O_{12}$, the half-value width (the FMR linewidth) $\Delta H$ was equal to 1.30 Oe. Regarding the magnetic thin films of $La_{0.14}Y_{2.86}Fe_{4.33}Ga_{0.67}O_{12}$, the half-value width (the FMR linewidth) $\Delta H$ was equal to 1.30 Oe. Regarding the magnetic thin films of $La_{0.15}Y_{2.85}Fe_{4.25}Ga_{0.75}O_{12}$, the half-value width (the FMR linewidth) $\Delta H$ was equal to 1.40 Oe. Regarding the magnetic thin films of $La_{0.16}Y_{2.84}Fe_{4.15}Ga_{0.85}O_{12}$, the half-value width (the FMR linewidth) $\Delta H$ was equal to 1.60 Oe. Regarding the magnetic thin films of $La_{0.17}Y_{2.83}Fe_{4.11}Ga_{0.89}O_{12}$, the half-value width (the FMR linewidth) $\Delta H$ was equal to 2.80 Oe.

The relation among the YIG composition, the saturation magnetization "$4\pi Ms$", and the half-value width (the FMR linewidth) $\Delta H$ are shown in FIG. 8.

For each of the samples, the magnetic thin film was cut and shaped into a chip as in the Example 1. A sample of the reflection-type S/N enhancer was completed which used the magnetic thin film. The sample of the reflection-type S/N enhancer had the structure of FIG. 1.

According to the samples of the reflection-type S/N enhancer, the angle $\theta_1$ between the longitudinal direction of the transducer and the <001> orientation of crystal in the magnetic thin film was variable in the range of 45° to −45°. Since the YIG crystal in the magnetic thin film is cubic, the range of the angle $\theta_1$ is symmetrical with respect to the <001> orientation. The samples of the reflection-type S/N enhancer provided a variable angle $\theta_2$ between the direction of the applied magnetic field (the bias magnetic field) and the transverse direction of the transducer in a horizontal plane. The transverse direction of the transducer was perpendicular to the longitudinal direction thereof.

Comparative samples were similarly made. According to the comparative samples, the angle $\theta_1$ between the longitudinal direction of the transducer and the <001> orientation of crystal in the magnetic thin film was variable outside the range of 45° to −45°.

Each of the samples of the reflection-type S/N enhancer and also the comparative samples was subjected to an external magnetic field or a bias magnetic field having a given strength (equal to about 5 G to 50 G), and the lowest value of a central frequency of a reflection loss was measured while magnetostatic wave was excited at varying angles $\theta_1$ and $\theta_2$.

Regarding the samples of the reflection-type S/N enhancer and also the comparative samples which had the magnetic thin films of $La_{0.10}Y_{2.90}Fe_{4.60}Ga_{0.40}O_{12}$, measurements and decisions were made as to the range of the sum of the angles $\theta_1$ and $\theta_2$ in which the samples served as reflection-type S/N enhancers for a 400-MHz band. These measurements and decisions were implemented in a way similar to that in the Example 1. The measurement result range $(\theta_1+\theta_2)$ was equal to +20° or -20° as shown in FIG. 8. Also, the performance index of typical one of these samples was measured and calculated as in the Example 1. The measurement result performance index was equal to 1.9 as shown in FIG. 8.

Regarding the samples of the reflection-type S/N enhancer and also the comparative samples which had the magnetic thin films of $La_{0.13}Y_{2.87}Fe_{4.39}Ga_{0.61}O_{12}$ measurements and decisions were made as to the range of the sum of the angles $\theta_1$ and $\theta_2$ in which the samples served as reflection-type S/N enhancers for a 400-MHz band. These measurements and decisions were implemented in a way similar to that in the Example 1. The measurement result range $(\theta_1+\theta_2)$ was between +9° and +31° or between -9° and -31° as shown in FIG. 8. Also, the performance index of typical one of these samples was measured and calculated as in the Example 1. The measurement result performance index was equal to 2.2 as shown in FIG. 8.

Regarding the samples of the reflection-type S/N enhancer and also the comparative samples which had the magnetic thin films of $La_{0.14}Y_{2.86}Fe_{4.33}Ga_{0.67}O_{12}$, measurements and decisions were made as to the range of the sum of the angles $\theta_1$ and $\theta_2$ in which the samples served as reflection-type S/N enhancers for a 400-MHz band. These measurements and decisions were implemented in a way similar to that in the Example 1. The measurement result range $(\theta_1+\theta_2)$ was between +6° and +34° or between -6° and -34° as shown in FIG. 8. Also, the performance index of typical one of these samples was measured and calculated as in the Example 1. The measurement result performance index was equal to 2.2 as shown in FIG. 8.

Regarding the samples of the reflection-type S/N enhancer and also the comparative samples which had the magnetic thin films of $La_{0.15}Y_{2.85}Fe_{4.25}Ga_{0.75}O_{12}$, measurements and decisions were made as to the range of the sum of the angles $\theta_1$ and $\theta_2$ in which the samples served as reflection-type S/N enhancers for a 400-MHz band. These measurements and decisions were implemented in a way similar to that in the Example 1. The measurement result range $(\theta_1+\theta_2)$ was between -40° and +40° as shown in FIG. 8. Also, the performance index of typical one of these samples was measured and calculated as in the Example 1. The measurement result performance index was equal to 2.2 as shown in FIG. 8.

Regarding the samples of the reflection-type S/N enhancer and also the comparative samples which had the magnetic thin films of $La_{0.16}Y_{2.84}Fe_{4.15}Ga_{0.85}O_{12}$, measurements and decisions were made as to the range of the sum of the angles $\theta_1$ and $\theta_2$ in which the samples served as reflection-type S/N enhancers for a 400-MHz band. These measurements and decisions were implemented in a way similar to that in the Example 1. The measurement result range $(\theta_1+\theta_2)$ was between -45° and +45° as shown in FIG. 8. Also, the performance index of typical one of these samples was measured and calculated as in the Example 1. The measurement result performance index was equal to 2.3 as shown in FIG. 8.

Regarding the samples of the reflection-type S/N enhancer and also the comparative samples which had the magnetic thin films of $La_{0.17}Y_{2.83}Fe_{4.11}Ga_{0.89}O_{12}$, measurements and decisions were made as to the range of the sum of the angles $\theta_1$ and $\theta_2$ in which the samples served as reflection-type S/N enhancers for a 400-MHz band. These measurements and decisions were implemented in a way similar to that in the Example 1. The measurement result range $(\theta_1+\theta_2)$ was between -50° and +50° as shown in FIG. 8. Also, the performance index of typical one of these samples was measured and calculated as in the Example 1. The measurement result performance index was equal to 4.2 as shown in FIG. 8.

Generally, the magnetic thin film has only a single layer. The magnetic thin film may have multiple layers designed to provide a wider frequency band of the related reflection-type S/N enhancer.

Comparative Example

Comparative samples were fabricated as follows. For each of the comparative samples, a $Gd_3Ga_5O_{12}$ substrate was prepared which was off-angled from the {110} plane by 3°. A magnetic thin film of YIG having composition "$La_{0.1}Y_{2.9}Fe_{4.7}Ga_{0.3}O_{12}$" was grown on the $Gd_3Ga_5O_{12}$ 2 substrate by liquid-phase epitaxy. The magnetic thin film had a thickness of 50 $\mu$m. The magnetic thin film exhibited a saturation magnetization "$4\pi Ms$" of 1,200 G at room temperature. Regarding the magnetic thin film, the half-value width (the FMR linewidth) $\Delta H$ was equal to 0.80 Oe.

For each of the comparative samples, the magnetic thin film was cut and shaped into a chip as in the Example 1. The comparative sample was completed which used the magnetic thin film. The comparative sample had the structure of FIG. 1.

Each of the comparative samples was subjected to an external magnetic field or a bias magnetic field having a given strength (equal to about 5 G to 50 G), and the lowest value of a central frequency of a reflection loss was measured while magnetostatic wave was excited at varying angles $\theta_1$ and $\theta_2$. The measurement result lowest values of the central frequencies were equal to 450 MHz or higher.

Conclusion

Figure 9:
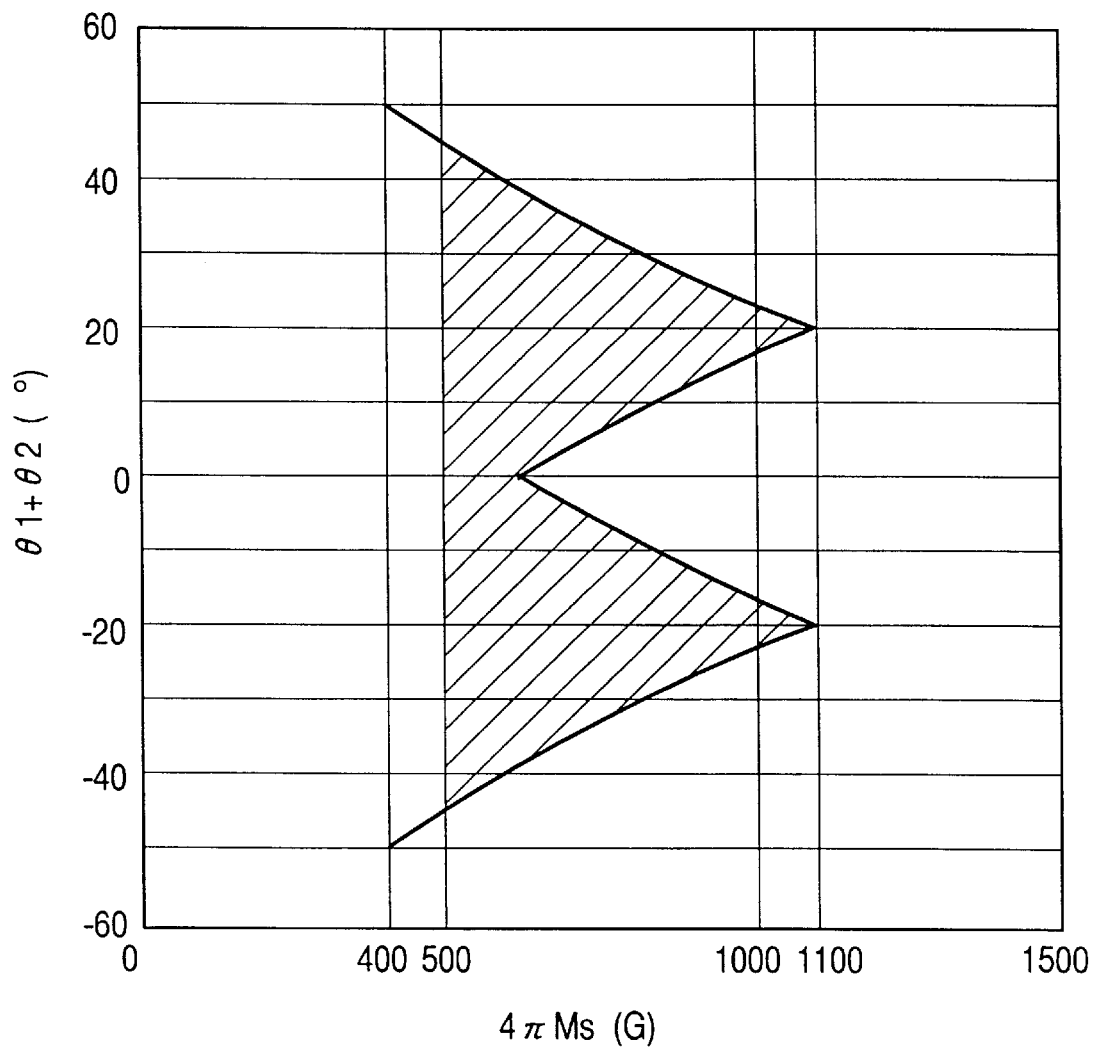
FIG. 9 is a diagram of a two-dimensional useful area defined by a saturation magnetization "$4\pi Ms$" and the sum of angles $\theta_1$ and $\theta_2$.

With reference to FIG. 9, a hatched area denotes a two-dimensional useful area defined by the saturation magnetization "$4\pi Ms$" and the sum of the angles $\theta_1$ and $\theta_2$. As shown in FIG. 9, it is difficult to provide a reflection-type S/N enhancer capable of operating at 400 MHz when a magnetic thin film therein has a saturation magnetization "$4\pi Ms$" of 1,100 G or greater. Also, it is difficult to provide a reflection-type S/N enhancer capable of operating at 400 MHz when a magnetic thin film therein has a saturation magnetization "$4\pi Ms$" of less than 500 G. It should be noted that this reflection-type S/N enhancer has a performance index of 4 or more which is in the practically unusable range. On the other hand, it is possible to provide a reflection-type S/N enhancer capable of operating at 400 MHz when a magnetic thin film therein has a saturation magnetization "$4\pi Ms$" in the range of 500 G to 1,100 G and the absolute value of the sum of the angles $\theta_1$ and $\theta_2$ is smaller than 45°.

What is claimed is:

1. A reflection-type S/N enhancer comprising:

a $Gd_3Ga_5O_{12}$ substrate off-angled from a {110} plane;

a magnetic thin film including a crystal of garnet and being formed on the $Gd_3Ga_5O_{12}$ substrate by liquid-phase epitaxy, the magnetic thin film having a saturation magnetization in a range of 500 G to 1,100 G;

a transducer for exciting magnetostatic wave in the magnetic thin film in response to an RF electric signal; and means for applying a bias magnetic field to the magnetic thin film;

wherein there is a relation as $|\theta_1+\theta_2|<45°$, where "$\theta_1$" denotes an angle between a longitudinal direction of the transducer and a <001> orientation of the crystal in the magnetic thin film, and "$\theta_2$" denotes an angle between a direction of the bias magnetic field and a transverse direction of the transducer in a horizontal plane, the transverse direction of the transducer being perpendicular to the longitudinal direction thereof.

2. A reflection-type S/N enhancer as recited in claim 1, wherein the $Gd_3Ga_5O_{12}$ substrate is off-angled from the {110} plane by an angle in a range of 1° to 5°.

3. A reflection-type S/N enhancer as recited in claim 1, wherein the magnetic thin film consists of one layer.

4. A reflection-type S/N enhancer as recited in claim 1, wherein the magnetic thin film includes multiple layers.

* * * * *